United States Patent
Yun et al.

(10) Patent No.: US 9,875,777 B2
(45) Date of Patent: Jan. 23, 2018

(54) SEMICONDUCTOR MEMORY DEVICE AND METHOD FOR OPERATING THE SAME

(71) Applicant: SK hynix Inc., Gyeonggi-do (KR)

(72) Inventors: Dae-Ho Yun, Gyeonggi-do (KR); Hee-Jin Byun, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 78 days.

(21) Appl. No.: 14/549,221

(22) Filed: Nov. 20, 2014

(65) Prior Publication Data
US 2015/0380068 A1  Dec. 31, 2015

(30) Foreign Application Priority Data
Jun. 30, 2014 (KR) .................. 10-2014-0080922

(51) Int. Cl.
*G11C 7/10* (2006.01)
*G11C 7/22* (2006.01)

(52) U.S. Cl.
CPC ............ *G11C 7/222* (2013.01); *G11C 7/1066* (2013.01)

(58) Field of Classification Search
CPC ........... G11C 7/222; G11C 7/12; G11C 7/109; G11C 7/1066
See application file for complete search history.

(56) References Cited

U.S. PATENT DOCUMENTS

| 6,198,674 B1 * | 3/2001 | Kim | G11C 7/1039 365/193 |
| 8,929,162 B1 * | 1/2015 | Fender | G11C 7/1051 365/193 |
| 2004/0052151 A1 * | 3/2004 | Jacobs | G11C 7/1066 365/233.13 |
| 2004/0145962 A1 * | 7/2004 | Heo | G11C 7/1051 365/233.1 |
| 2005/0232063 A1 * | 10/2005 | Na | G11C 7/1051 365/193 |

FOREIGN PATENT DOCUMENTS

KR  1020050101864  10/2005

* cited by examiner

*Primary Examiner* — Douglas King
(74) *Attorney, Agent, or Firm* — IP & T Group LLP

(57) ABSTRACT

A semiconductor memory device includes: an enable signal generation portion suitable for generating a data output enable signal activated at a predetermined first moment corresponding to column address strobe (CAS) latency based on a read command, a strobe signal generation portion suitable for generating a data strobe signal which has a preamble section until the data output enable signal is activated from a predetermined second moment ahead of the first moment based on the read command and toggles based on a source clock during an activated section of the data output enable signal, and a data output portion suitable for outputting internal data in synchronization with the data strobe signal during the activated section of the data output enable signal.

19 Claims, 10 Drawing Sheets

FIG. 4
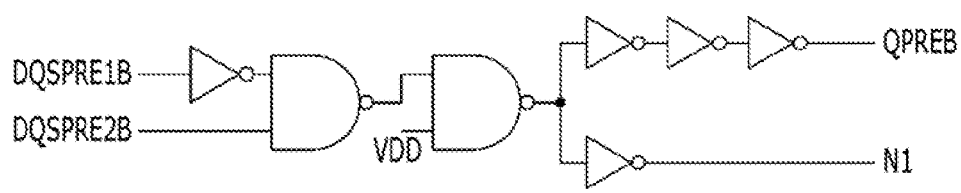
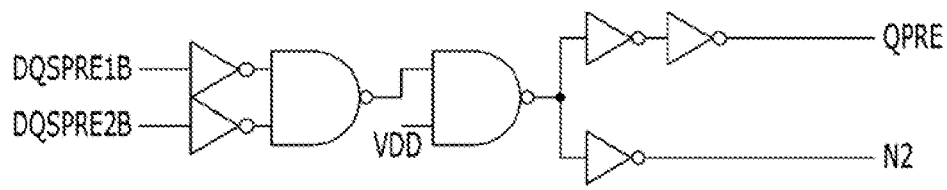
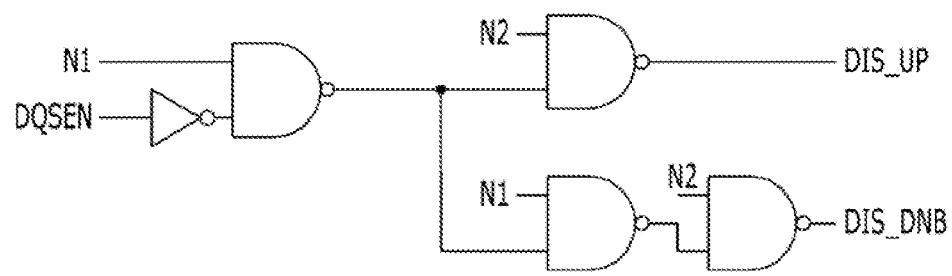

SEMICONDUCTOR MEMORY DEVICE AND METHOD FOR OPERATING THE SAME

CROSS-REFERENCE TO RELATED APPLICATIONS

The present application claims priority of Korean Patent Application No. 10-2014-0080922, filed on Jun. 30, 2014, which is incorporated herein by reference in its entirety.

BACKGROUND

1. Field

Various embodiments of the present invention relate to a semiconductor design technology, and more particularly, to a semiconductor memory device transmitting data by using a data strobe signal.

2. Description of the Related Art

In general, semiconductor memory devices such as a dynamic random access memory (DRAM) receive write data from a chip set, for example, a memory controller, and transmit read data to the chip set. In a synchronous memory system, both the chip set and a semiconductor memory device operate in synchronization with a system clock. However, when data are transmitted from the chip set to the semiconductor memory device, the data and the system clock have different traces so that the data and the system clock have different loads. In addition, a skew occurs between the data and the system dock due to a positional difference among a plurality of semiconductor memory devices included in the memory system.

To reduce a skew between the data and the system clock, a data strobe signal DQS is transmitted together with the data when the data is transmitted from the chip set to a semiconductor memory device. The data strobe signal DQS is referred to as an echo clock. The data strobe signal DQS has the same trace as the data, thus a skew occurring due to a positional difference may be minimized since the semiconductor memory device strobes the data based on the data strobe signal DQS. Therefore, the semiconductor memory device transmits a read data strobe signal DQS along with data to the chip set during a read operation.

FIG. 1 is a timing diagram for describing a read operation of a semiconductor memory device.

FIG. 1 shows timing of signals when column address strobe (CAS) latency CL is 2, and a burst length BL is 4. For reference, a CAS latency CL defines the number of clock cycles until data is outputted from a moment when a read command is inputted. Further, a burst length BL defines the number of data which are successively processed, that is, inputted outputted. Additionally, "CLK" denotes a source clock, and "/CLK" denotes a complementary source clock.

As illustrated in FIG. 1, a data strobe signal DQS has a preamble section representing the beginning of data transmission one clock cycle, that is, 1tCK) before a CAS latency CL. The data strobe signal DQS has the preamble section representing the beginning of the data transmission 1tCK before data is actually outputted in response to a read command READ. The preamble section of the data strobe signal DQS may introduce that the arrival of the data is imminent to a memory controller, which receives and processes the data outputted from the semiconductor memory device. For example, the data strobe signal DQS may start toggling from a high impedance Hi-Z state or change to a predetermined logic level, for example, a low logic level, in the preamble section and which is recognized in the memory controller.

To accurately transmit data between a semiconductor memory device and a memory controller, it may be highly important to accurately define a preamble section of a data strobe signal.

SUMMARY

Various embodiments of the present invention are directed to a semiconductor memory device that may generate a data strobe signal by accurately defining a preamble section at all times regardless of variations in process, voltage, and temperature (PVT).

In accordance with an embodiment of the present invention, a semiconductor memory device includes: an enable signal generation portion suitable for generating a data output enable signal activated at a predetermined first moment corresponding to column address strobe (CAS) latency based on a read command; a strobe signal generation portion suitable for generating a data strobe signal, which has a preamble section until the data output enable signal is activated from a predetermined second moment ahead of the first moment based on the read command and toggles based on a source clock during an activated section of the data output enable signal; and a data output portion suitable for outputting internal data in synchronization with the data strobe signal during the activated section of the data output enable signal.

In accordance with an embodiment of the present invention, a in method for operating a semiconductor memory device includes: generating a data output enable signal activated at a predetermined first moment corresponding to column address strobe (CAS) latency based on a read command; setting a preamble section of a data strobe signal, which begins from a predetermined second moment ahead of the first moment based on the read command and terminates based on the activating of the data output enable signal; and making the data strobe signal toggle based on a source clock during an activated section of the data output enable signal.

BRIEF DESCRIPTION OF THE DRAWINGS

FIG. 4 is a detailed diagram of an operation control block shown in FIG. 3.

DETAILED DESCRIPTION

Figure 1:
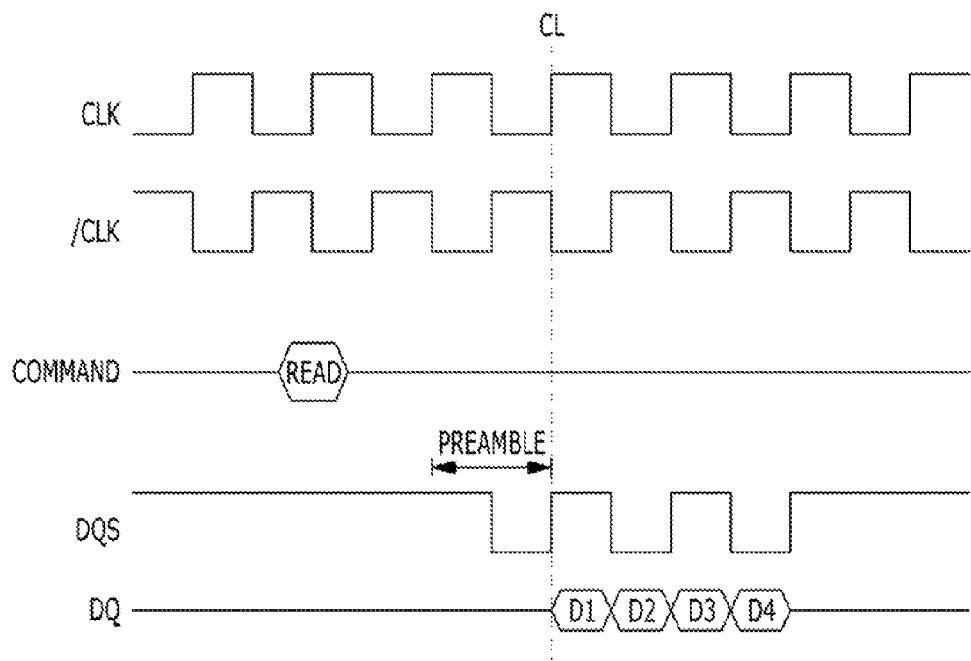
FIG. 1 is a timing diagram for describing a read operation of a semiconductor memory device.

Various embodiments of the present invention are described below in more detail with reference to the accompanying drawings. These embodiments are provided so that this disclosure is thorough and complete, and will fully convey the scope of the present invention to those skilled in the art. All "embodiments" referred to in this disclosure refer to embodiments of the present invention disclosed herein. The embodiments presented are mere examples and are not intended to limit the present invention. Throughout the disclosure, reference numerals correspond directly to like parts in the various figures and embodiments of the present invention.

The drawings are not necessarily to scale and in some instances, proportions may have been exaggerated to clearly illustrate features of the embodiments. In this specification, specific terms have been used. The terms are used to describe the present invention, and are not used to qualify the sense or limit the scope of the present invention.

It is also noted that in this specification, "and/or" represents that one or more of components arranged before and after "and/or" is included. Furthermore, "connected/coupled" refers to one component not only directly coupling another component but also indirectly coupling another component through an intermediate component. In addition, a singular form may include a plural form as long as it is not specifically mentioned in a sentence. Furthermore, "include/comprise" or "including/comprising" used in the specification represents that one or more components, steps, operations, and elements exist or are added.

Figure 2:
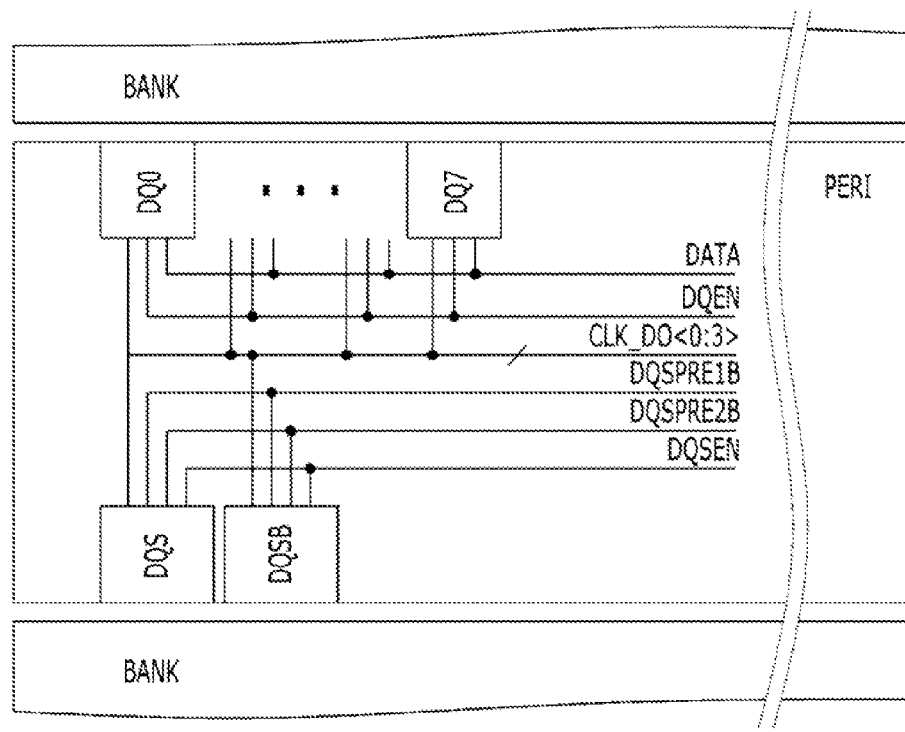
FIG. 2 is a block diagram illustrating a scheme for generating a data strobe signal.

FIG. 2 is a block diagram illustrating a scheme for generating a data strobe signal DQS.

Referring to FIG. 2, the data strobe signal DQS of a semiconductor memory device is generated in a section in which a strobe enable signal DQSEN is activated. Data DATA stored in the semiconductor memory device is outputted along with the data strobe signal DQS in a section in which a data output enable signal DQEN is activated.

That is, an operation of generating the data strobe signal DQS and an operation of outputting the data DATA are controlled independently based on different enable signals DQSEN and DQEN. For reference, in FIG. 2, "DQSPRE1B" denotes a first read signal, "DQSPRE2B" denotes a second read signal, and "CLK_DO<0:3>" denotes toggling clocks CLK_DO<0:3> for data output operation. Further, "BANK" denotes a memory bank region, "PERI" denotes a peripheral region, "DQ0" to "DQ7" denotes data output blocks, and "DQS" and "DQSB" denote generation blocks for the data strobe signal DQS and a complementary data strobe signal DQSB.

Figure 3:
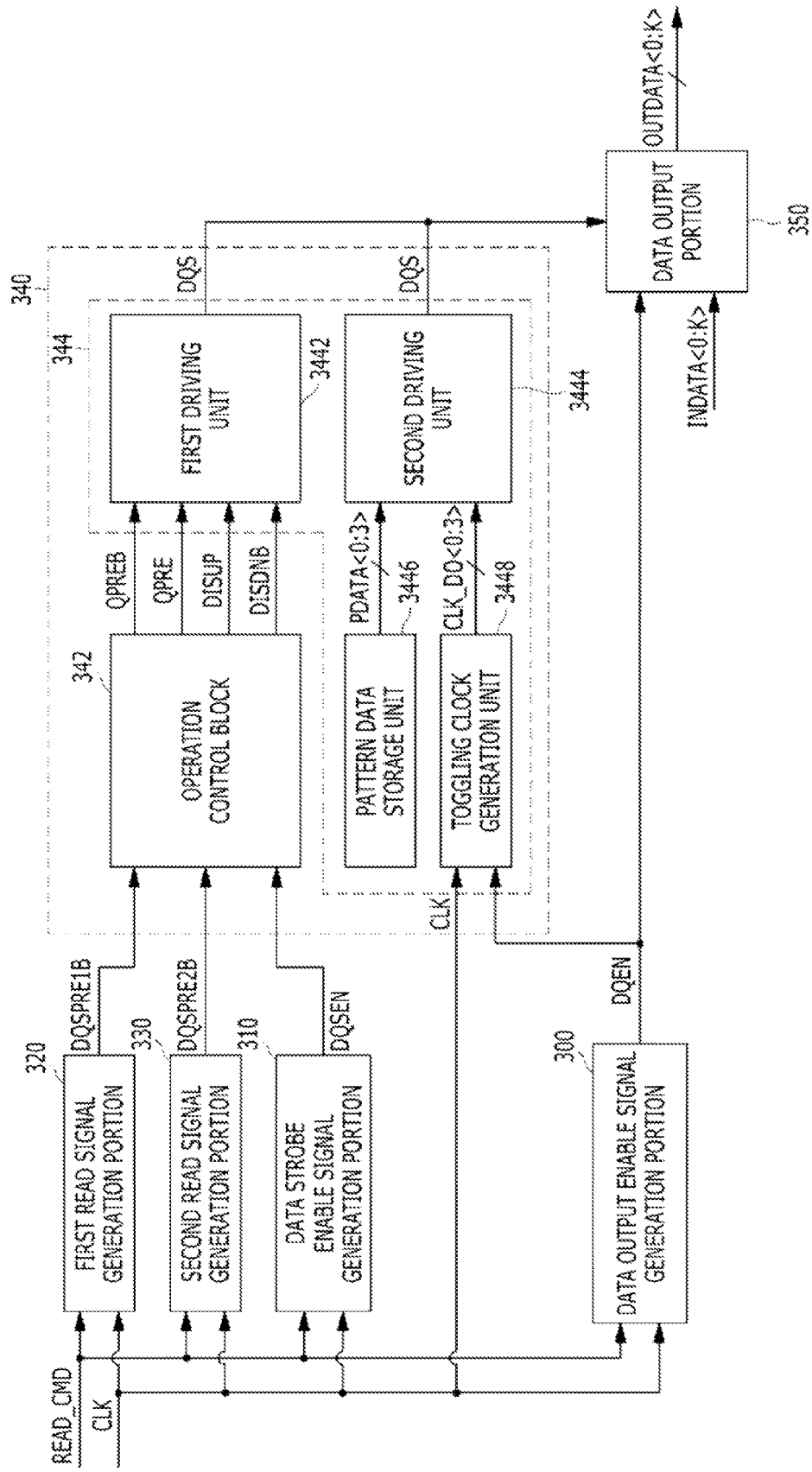
FIG. 3 is a block diagram illustrating a semiconductor memory device including a data strobe signal generation circuit employing the scheme shown in FIG. 2.

FIG. 3 is a block diagram illustrating a semiconductor memory device including a data strobe signal generation circuit employing the scheme shown in FIG. 2.

Referring to FIG. 3, the semiconductor memory device includes a data output enable signal generation portion 300, a data strobe enable signal generation portion 310, a first read signal generation portion 320, a second read signal generation portion 330, a strobe signal generation portion 340, and a data output portion 350. The strobe signal generation portion 340 includes an operation control block 342 and a strobe signal output block 344. The strobe signal output block 344 includes a first driving unit 3442, a second driving unit 3444, a pattern data storage unit 3446, and a toggling clock generation unit 3448.

The data output enable signal generation portion 300 generates a data output enable signal DQEN activated at a predetermined first moment corresponding to CAS latency CL in response to a read command READ_CMD.

The data strobe enable signal generation portion 310 generates a data strobe enable signal DQSEN activated at a predetermined second moment ahead of the first moment in response to the read command READ_CMD.

The first read signal generation portion 320 generates a first read signal DQSPRE1B which is activated at the second moment and deactivated at the first moment. The second moment may be set to a moment as early as one clock cycle (1tCK) of a source clock CLK ahead of the first moment.

The second read signal generation portion 330 generates a second read signal DQSPRE2B by delaying the first read signal DQSPRE1B as long as a half clock cycle (½tCK) of the source clock CLK.

Each of the first and second moments is synchronized with an edge of the source clock CLK. That is, as illustrated in the drawing, the data output enable signal generation portion 300, the data strobe enable signal generation portion 310, the first read signal generation portion 320 and the second read signal generation portion 330 operate in response to the source clock CLK and operate in a source clock CLK domain. Thus, the data output enable signal DQEN, the data strobe enable signal DQSEN, the first read signal DQSPRE1B and the second read signal DQSPRE2B are synchronized with the edge of the source clock CLK.

The strobe signal generation portion 340 generates a data strobe signal DQS corresponding to the read command READ_CMD. The data strobe signal DQS has a preamble section in a section in which the data strobe enable signal DQSEN is activated and the data output enable signal DQEN is deactivated, and toggles in response to the source clock CLK in a section in which the data strobe enable signal DQSEN and the data output enable signal DQEN are activated. Therefore, the strobe signal generation portion 340 defines a section ranging from the second moment at which the data strobe enable signal DQSEN is activated to the first moment at which the data output enable signal DQEN is activated, as the preamble section of the data strobe signal DQS.

The operation control block 342 generates a first preamble signal QPREB, a second preamble signal QPRE, a third preamble signal DIS_UP and a fourth preamble signal DIS_DNB in response to the first read signal DQSPRE1B, the second read signal DQSPRE2B and the data strobe enable signal DQSEN. The first to fourth preamble signals QPREB, QPRE, DIS_UP and DIS_DNB change to a predetermined logic level in the activated section of the data strobe enable signal DQSEN and define the preamble section of the data strobe signal DQS and a non-preamble section of the data strobe signal DQS, respectively.

The strobe signal output block 344 sets the preamble section in the data strobe signal DQS in response to the first to fourth preamble signals QPREB, QPRE, DIS_UP and DIS_DNB. Also, the strobe signal output block 344 makes the data strobe signal DQS toggle in response to the source clock CLK in the activated section of the data output enable signal DQEN, that is, a non-preamble section.

The first driving unit 3442 drives an output node of the data strobe signal DQS to a predetermined logic level in the preamble section in response to the first to fourth preamble signals QPREB, QPRE, DIS_UP and DIS_DNB. Additionally, the first driving unit 3442 does not drive the output node of the data strobe signal DQS in the non-preamble section, that is, the activated section of the data output enable signal DQEN.

The second driving unit 3444 does not drive the output node of the data strobe signal DQS in the preamble section, that is, an operation section of the first driving unit 3442. Additionally, the second driving unit 3444 drives predetermined toggling pattern data PDATA<0:3> to the output node of the data strobe signal DQS in response to the source dock CLK in the activated section of the data output enable signal DQEN.

The pattern data storage unit 3446 stores the toggling pattern data PDATA<0:3> having a 4-bit pattern.

The toggling clock generation unit 3448 generates toggling clocks CLK_DO<0:3> which are sequentially and repeatedly activated in synchronization with the toggling of the source clock CLK in the activated section of the data output enable signal DQEN. The activated sections of the toggling clocks CLK_DO<0:3> do not overlap with each other.

The data output portion 350 outputs internal data INDATA<0:K> in synchronization with the toggling of the data strobe signal DQS to an external device in the activated section of the data output enable signal DQEN.

Figure 5:
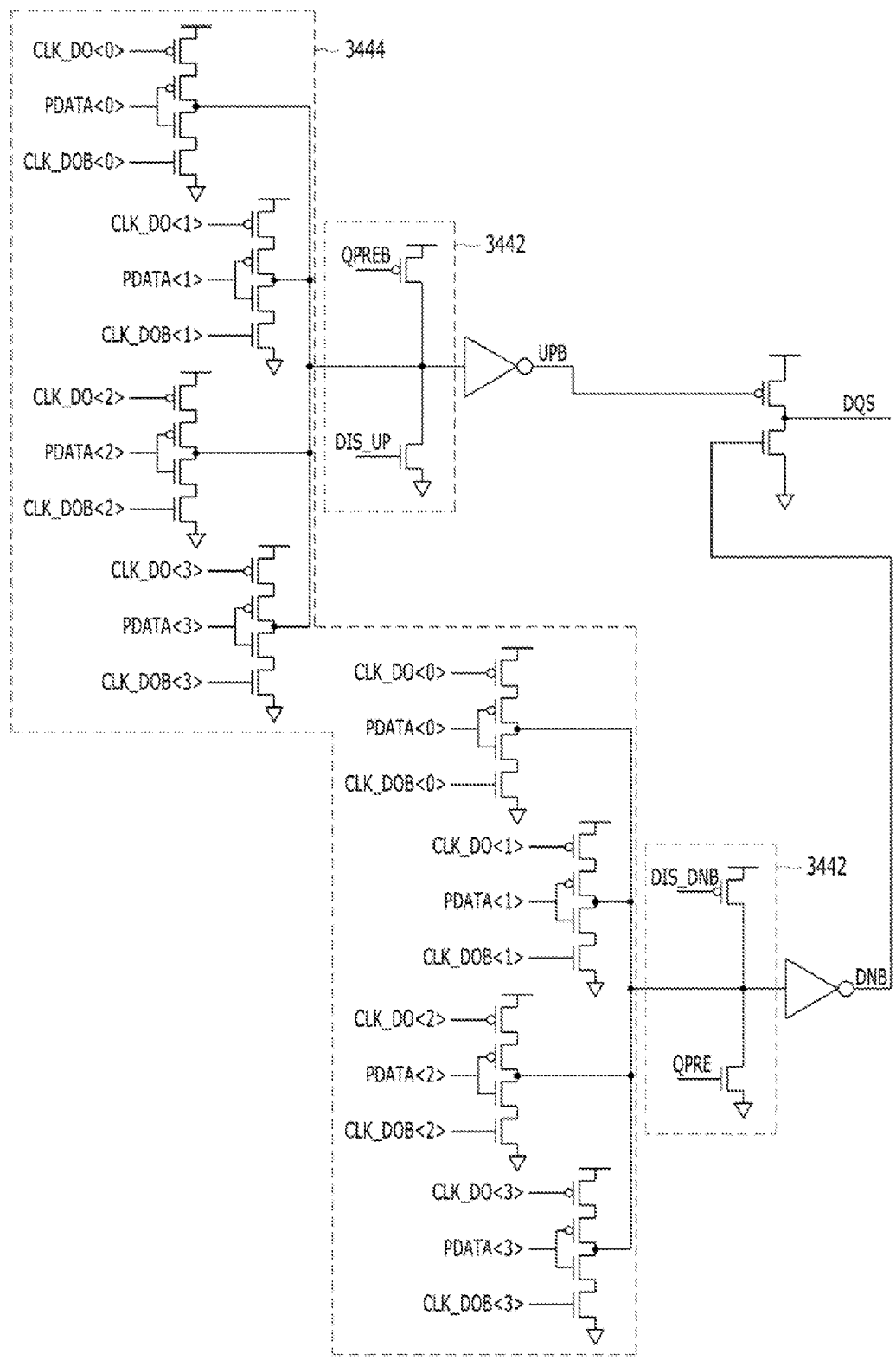
FIG. 5 is a detailed diagram of a strobe signal output block shown in FIG. 3.
Figure 6:
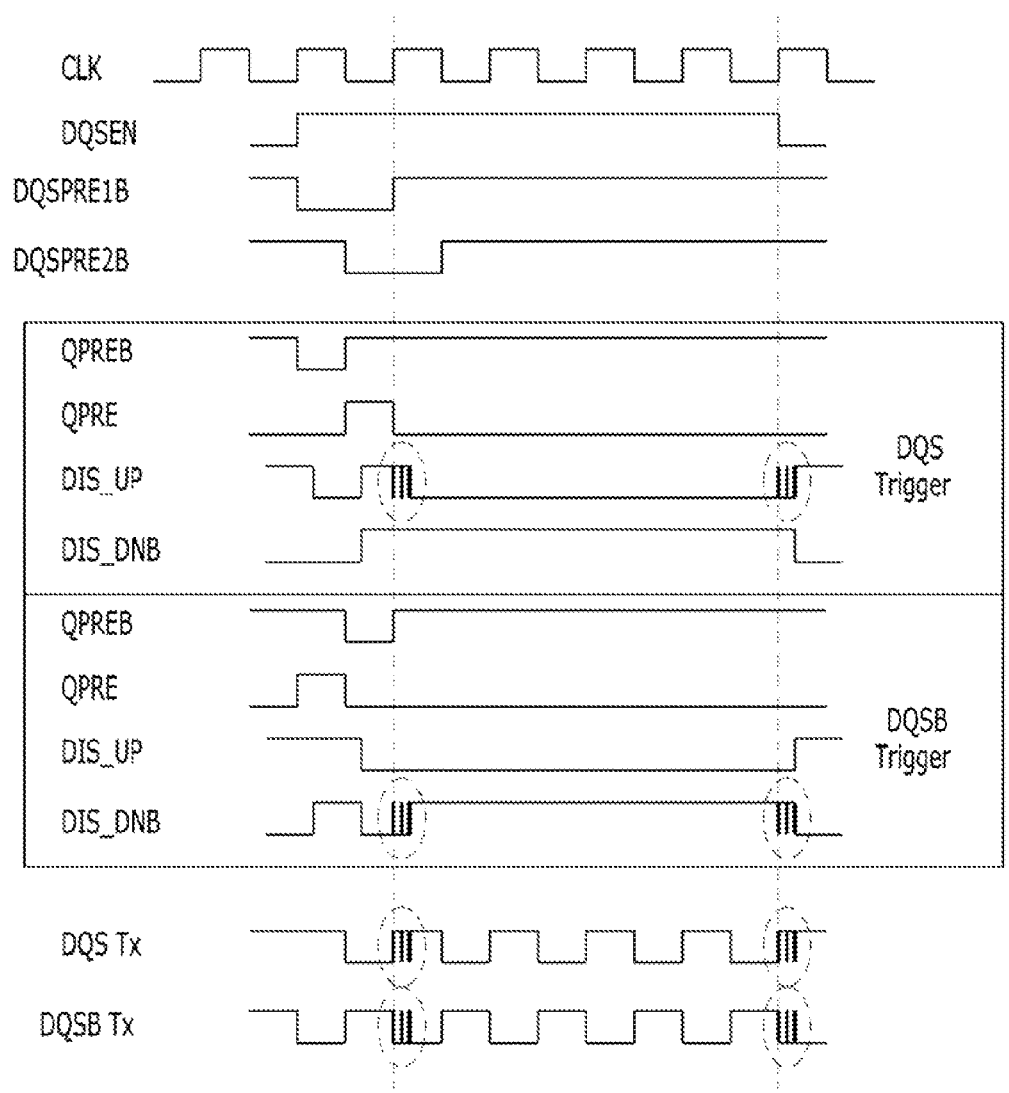
FIG. 6 is a timing diagram for describing an operation of the semiconductor memory device shown in FIG. 3.

FIG. 4 is a detailed diagram of the operation control block 342 shown in FIG. 3. FIG. 5 is a detailed diagram of the strobe signal output block 344 shown in FIG. 3. FIG. 6 is a timing diagram for describing an operation of the semiconductor memory device shown in FIG. 3.

Referring to FIG. 4, the operation control block 342 generates the first preamble signal QPREB and the second preamble signal QPRE in response to the first read signal DQSPRE1B and the second read signal DQSPRE2B, and subsequently generates the third preamble signal DIS_UP and the fourth preamble signal DIS_DNB in response to the data strobe enable signal DQSEN, the first preamble signal QPREB and the second preamble signal QPRE.

Referring to FIG. 5, the first driving unit 3442 defines the preamble section of the data strobe signal DQS in response to the first to fourth preamble signals QPREB, QPRE, DIS_UP and DIS_DNB. The first preamble signal QPREB and the third preamble signal DIS_UP drive a pull-up output node UPB for the data strobe signal DQS. The second preamble signal QPRE and the fourth preamble signal DIS_DNB drive a pull-down output node DNB for the data strobe signal DQS.

Specifically, an operation of the operation control block 342 and an operation of the first driving unit 3442 are described in following Table 1.

the data strobe enable signal DQSEN is activated to a logic high level.

Therefore, the first driving unit 3442 does not operate or drives the data strobe signal DQS to a predetermined logic level in the section in which the data strobe enable signal DQSEN is activated to the logic high level. For reference, "CLK_DOB<0:3>" denotes complementary toggling clocks.

Referring to FIG. 6, the data strobe signal DQS is generated in the section in which the data strobe enable signal DQSEN is activated to the logic high level.

The logic levels of the data strobe enable signal DQSEN, the first read signal DQSPRE1B and the second read signal DQSPRE2B are determined based on the CAS latency CL as described above with reference to FIG. 3. Therefore, their logic levels change as shown in FIG. 6 based on the CAS latency CL.

Specifically, as the data strobe enable signal DQSEN and the first read signal DQSPRE1B are simultaneously activated during one clock cycle (1tCK) of the source clock CLK from a moment that comes ahead of a moment corresponding to the CAS latency CL, and the second read signal DQSPRE2B is activated after a half clock cycle (½tCK) of the source clock. CLK from a moment when the first read signal DQSPRE1B is activated, the first driving unit 3442 operates and the second driving unit 3444 does not operate. Thus, a preamble operation that drives the data strobe signal DQS to a predetermined logic level is performed.

Subsequently, when the first read signal DQSPRE1B is deactivated based on the CAS latency CL, and then the second read signal DQSPRE2B is deactivated at an interval of a half clock cycle (½tCK) of the source clock CLK, the first driving unit 3442 does not operate and the second driving unit 3444 operates. Thus, an operation for toggling the data strobe signal DQS in response to the source clock CLK is performed.

As illustrated in FIG. 6, the preamble operation and the toggling operation of the data strobe signal DQS may be normally performed in harmony with the first read signal DQSPRE1B and the second read signal DQSPRE2B in the section in which the data strobe enable signal DQSEN is activated to the logic high level.

Furthermore, the operation control block 342 sets the first preamble signal QPREB and the third preamble signal DIS_UP to have the same logic level and the second preamble signal QPRE and the fourth preamble signal

TABLE 1

| DQSPRE1B | DQSPRE2B | DQSEN | QPREB | N1 | QPRE | N2 | DIS_UP | DIS_DNB | FIRST DRIVING UNIT |
|---|---|---|---|---|---|---|---|---|---|
| H | H | H | H | H | L | H | L | H | NOT OPERATE |
| L | H | H | L | L | L | H | L | L | DQS = H |
| L | L | H | H | H | H | L | H | H | DQS = L |
| H | L | H | H | H | L | H | L | H | NOT OPERATE |
| H | H | L | H | H | L | H | H | L | DQS OUTPUT OFF |
| L | H | L | L | L | L | H | L | L | DQS = H |
| L | L | L | H | H | H | L | H | H | DQS = L |
| H | L | L | H | H | L | H | H | L | DQS OUTPUT OFF |

Referring to Table 1, the operation control block 342 sets the first preamble signal QPREB and the fourth preamble signal DIS_DNB to have the same logic level and the second preamble signal QPRE and the third preamble signal DIS_UP to have the same logic level in a section in which DIS_DNB to the same logic level in a section in which the data strobe enable signal DQSEN is deactivated to a logic low level.

The first driving unit 3442 forcibly turns off an output of the data strobe signal DQS or drives the data strobe signal DQS to a predetermined logic level by operating at all times in the section in which the data strobe enable signal DQSEN is deactivated to the logic low level. Therefore, the data strobe signal DQS may not toggle since there is no condition in which the second driving unit 3444 may operate.

Referring to FIG. 6, the first driving unit 3442 turns off the output of the data strobe signal DQS in the section in which the data strobe enable signal DQSEN is deactivated.

That is, the logic levels of the first preamble signal QPREB and the second preamble signal QPRE are fixed regardless of whether the data strobe enable signal DQSEN is activated. The logic levels of the first preamble signal QPREB and the second preamble signal QPRE change in response to the first read signal DQSPRE1B and the second read signal DQSPRE2B. Therefore, as illustrated in FIG. 4, the data strobe enable signal DQSEN is not used when the operation control block 342 generates the first preamble signal QPREB and the second preamble signal QPRE.

However, the logic levels of the third preamble signal DIS_UP and the fourth preamble signal DIS_DNB change based on whether the data strobe enable signal DQSEN is activated. Therefore, as illustrated in FIG. 4, the data strobe enable signal DQSEN is used when the operation control block 342 generates the third preamble signal DIS_UP and the fourth preamble signal DIS_DNB.

Particularly, the logic level of third preamble signal DIS_UP is the same as the level of the second preamble signal QPRE or the level of the first preamble signal QPREB based on whether the data strobe enable signal DQSEN is activated. Similarly, the logic level of the fourth preamble signal DIS_DNB is the same as the level of the first preamble signal QPREB or the level of the second preamble signal QPRE based on whether data strobe enable signal DQSEN is activated. Therefore, as illustrated in FIG. 4, a signal N1 affected by the first preamble signal QPREB and a signal N2 affected by the second preamble signal QPRE are used when the operation control block 342 generates the third preamble signal DIS_UP and the fourth preamble signal DIS_DNB.

As described above, there is a difference between a method for generating the first preamble signal QPREB and the second preamble signal QPRE and a method for generating the third preamble signal DIS_UP and the fourth preamble signal DIS_NB.

Particularly, the method for generating the first preamble signal QPREB and the second preamble signal QPRE directly uses the first read signal DQSPRE1B and the second read signal DQSPRE2B. The method for generating the third preamble signal DIS_UP and the fourth preamble signal DIS_DNB uses the signal N1 affected by the first preamble signal QPREB and the signal N2 affected by the second preamble signal QPRE instead of directly using the first read signal DQSPRE1B and the second read signal DQSPRE2B.

When variations in process, voltage and temperature that is, PVT variations, occur as illustrated in FIG. 6, a skew difference does not occur between an edge of the source clock CLK and the first and second preamble signals QPREB and QPRE due to the difference between the generation methods. However, a skew difference may occur between the edge of the source clock CLK and the third and fourth preamble signals DIS_UP and DIS_DNB. Consequently, there may be a skew difference between the data strobe signal DQS and the edge of the source clock CLK depending on the variations in the PVT.

Figure 7:
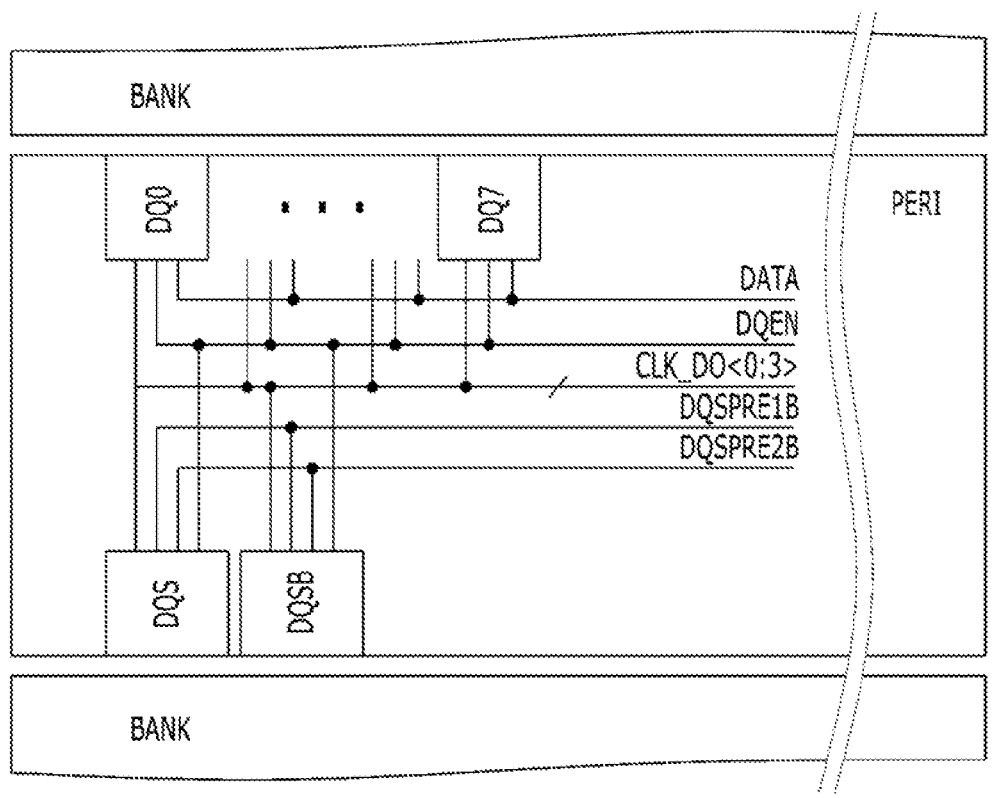
FIG. 7 is a block diagram illustrating a scheme for generating a data strobe signal in accordance with an embodiment of the present invention.

FIG. 7 is a block diagram illustrating a scheme for generating a data strobe signal in accordance with an embodiment of the present invention.

Referring to FIG. 7, an operation for generating the data strobe signal DQS in a semiconductor memory device in accordance with the embodiment of the present invention is performed in a section in which a data output enable signal DQEN is activated. Additionally, an operation for outputting data DATA stored in the semiconductor memory device along with the data strobe signal DQS is performed in the section in which the data output enable signal DQEN is activated.

That is, the operation for generating the data strobe signal DQS and the operation for outputting the data DATA are controlled based on the same enable signal DQEN. For reference, in FIG. 7, "DQSPRE1B" denotes a first read signal, "DQSPRE2B" denotes a second read signal, and "CLK_DO<0:3>" denotes toggling clocks CLK_DO<0:3> for a data output operation. Further, "BANK" denotes a memory bank region, "PERI" denotes a peripheral region, "DQ0" to "DQ7" denotes data output blocks, and "DQS" and "DQSB" denote generation blocks for the data strobe signal DQS and a complementary data strobe signal DQSB.

Figure 8:
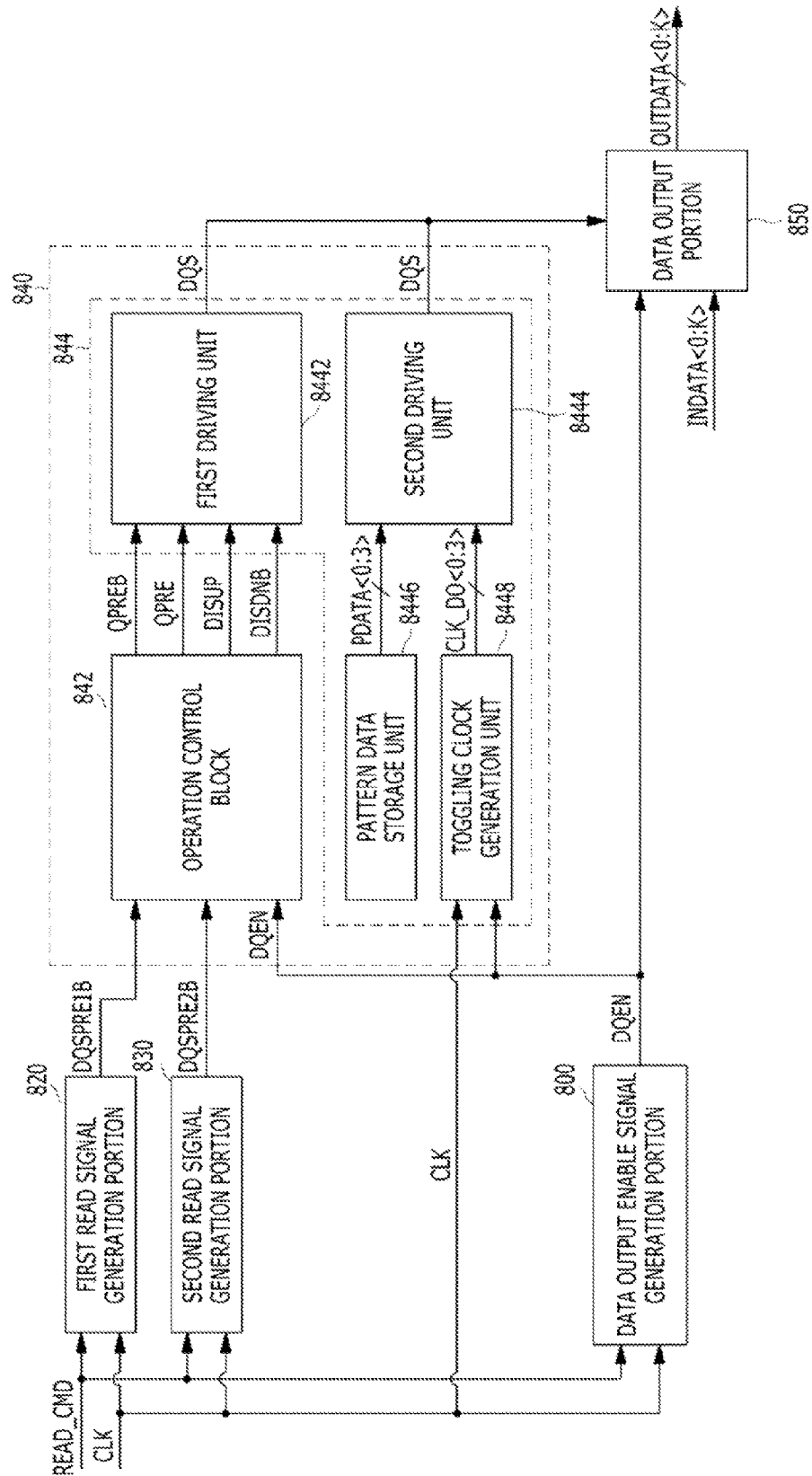
FIG. 8 is a block diagram illustrating a semiconductor memory device including a data strobe signal generation circuit employing the scheme shown in FIG. 7.

FIG. 8 is a block diagram illustrating a semiconductor memory device including a data strobe signal generation circuit employing the scheme shown in FIG. 7.

The semiconductor memory device including the circuit for generating the data strobe signal DQS includes a data output enable signal generation portion 800, a first read signal generation portion 820, a second read signal generation portion 830, a strobe signal generation portion 840, and a data output portion 850. The strobe signal generation portion 840 includes an operation control block 842 and a strobe signal output block 844. The strobe signal output block 844 includes a first driving unit 8442, a second driving unit 8444, a pattern data storage unit 8446, and a toggling clock generation unit 8448.

The data output enable signal generation portion 800 generates a data output enable signal DQEN activated at a predetermined first moment corresponding to CAS latency CL in response to a read command READ_CMD.

The first read signal generation portion 820 generates a first read signal DQSPRE1B which is activated at a predetermined second moment ahead of a moment corresponding to the CAS latency CL in response to the read command READ_CMD and deactivated at the first moment. The second moment may be set to a moment ahead of the first moment by as much as one clock cycle (1tCK) of a source clock CLK.

The second read signal generation portion 830 generates a second read signal DQSPRE2B by delaying the first read signal DQSPRE1B by as long as a half clock cycle (½tCK) of the source clock CLK.

Each of the first and second moments is synchronized with an edge of the source clock CLK. That is, as illustrated in the drawing, the data output enable signal generation portion 800, the first read signal generation portion 820 and the second read signal generation portion 830 operate in a source clock CLK domain in response to the source clock CLK. Thus, the data output enable signal DQEN, the first read signal DQSPRE1B and the second read signal DQSPRE2B are synchronized with the edge of the source clock CLK.

The strobe signal generation portion 840 generates a data strobe signal DQS corresponding to the read command READ_CMD. The data strobe signal DQS has a preamble section in a section in which the data output enable signal DQEN is deactivated, and toggles in response to the source clock CLK in a section in which the data output enable signal DQEN is activated. That is, the strobe signal generation portion 840 generates the data strobe signal DQS by defining the preamble section and a non-preamble section based on a moment when the data output enable signal DQEN is activated. Therefore, the strobe signal generation portion 840 defines a section ranging from a second moment at which the read command READ_CMD is inputted to the first moment at which the data output enable signal DQEN is activated, as the preamble section of the data strobe signal DQS.

The operation control block 842 generates a first preamble signal QPREB, a second preamble signal QPRE, a third preamble signal DIS_UP and a fourth preamble signal DIS_DNB in response to the first read signal DQSPRE1B, the SECOND read signal DQSPRE2B and the data output enable signal DQEN. The first to fourth preamble signals QPREB, QPRE, DIS_UP and DIS_DNB change to a logic level based on an activated moment of the data output enable signal DQEN and define the preamble section of the data strobe signal DQS and the non-preamble section of the data strobe signal DQS, respectively.

The strobe signal output block 844 sets the preamble section in the data strobe signal DQS in response to the first to fourth preamble signals QPREB, QPRE, DIS_UP and DIS_DNB. Additionally, the strobe signal output block 844 makes the data strobe signal DQS toggle in response to the source clock CLK in the non-preamble section, that is, the activated section of the data output enable signal DQEN.

The first driving unit 8442 drives an output node of the data strobe signal DQS to a predetermined logic level in the preamble section in response to the first to fourth preamble signals QPREB, QPRE, DIS_UP and DIS_DNB. Furthermore, the first driving unit 8442 does not drive the output node of the data strobe signal DQS in the non-preamble section, that is, the activated section of the data output enable signal DQEN.

The second driving unit 8444 does not drive the output node of the data strobe signal DQS in the preamble section, that is, an operation section of the first driving unit 8442. Moreover, the second driving unit 8444 drives predetermined toggling pattern data PDATA<0:3> to the output node of the data strobe signal DQS in response to the source clock CLK in the activated section of the data output enable signal DQEN.

The pattern data storage unit 8446 stores the toggling pattern data PDATA<0:3> having a 4-bit pattern.

The toggling clock generation unit 8448 generates toggling clocks CLK_DO<0:3> which are sequentially and repeatedly activated in synchronization with the toggling of the source clock CLK in the activated section of the data output enable signal DQEN. The activated sections of the toggling docks CLK_DO<0:3> do not overlap with each other.

The data output portion 850 outputs internal data INDATA<0:K> in synchronization with the toggling of the data strobe signal DQS to an external device in the activated section of the data output enable signal DQEN.

Figure 9:
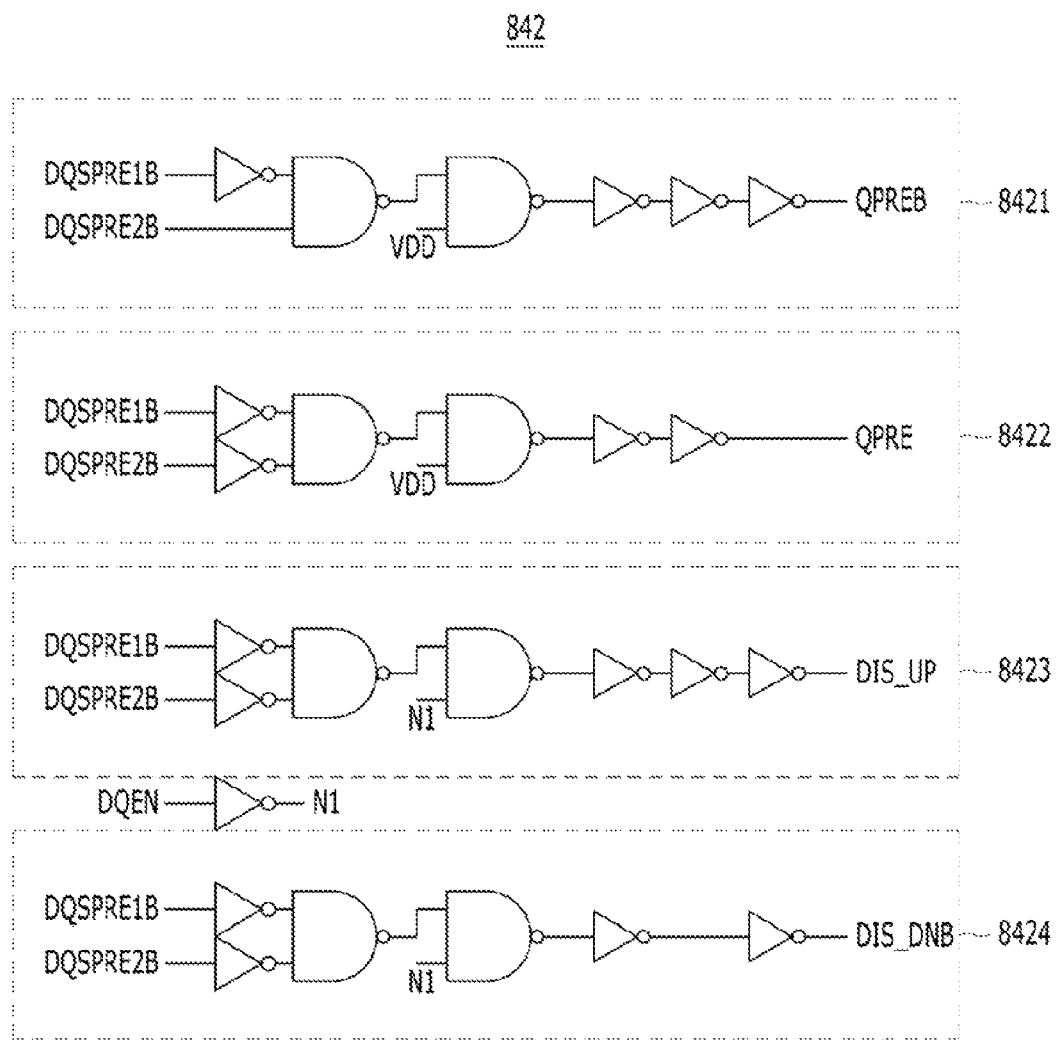
FIG. 9 is a detailed diagram of an operation control block shown in FIG. 8.

FIG. 9 is a circuit diagram illustrating the operation control block among constituent elements of the circuit for generating the data strobe signal shown in FIG. 8.

Referring to FIG. 9, the operation control block 842 generates the first preamble signal QPREB and the second preamble signal QPRE in response to the first read signal DQSPRE1B and the second read signal DQSPRE2B, and subsequently generates the third preamble signal DIS_UP and the fourth preamble signal DIS_DNB in response to the first read signal DQSPRE1B, the second read signal DQSPRE2B and the data output enable signal DQEN.

Specifically, the operation control block 842 includes a first preamble signal generation unit 8421, a second preamble signal generation unit 8422, a third preamble signal generation unit 8423, and a fourth preamble signal generation unit 8424.

The first preamble signal generation unit 8421 maintains an activated state in an activated section of the first read signal DQSPRE1B and generates the first preamble signal QPREB by inverting the second read signal DQSPRE2B in a deactivated section of the first read signal DQSPRE1B.

The second preamble signal generation unit 8422 maintains a deactivated state in the activated section of the first read signal DQSPRE1B and generates the second preamble signal QPRE by inverting the second read signal DQSPRE2B in the deactivated section of the first read signal DQSPRE1B.

The third preamble signal generation unit 8423 maintains a deactivated state in a deactivated section of the data output enable signal DQEN, and maintains an activated state in the activated section of the data output enable signal DQEN and the first read signal DQSPRE1B, and generates the third preamble signal DIS_UP by inverting the second read signal DQSPRE2B in the activated section of the data output enable signal DQEN and the deactivated section of the first read signal DQSPRE1B.

The fourth preamble signal generation unit 8424 maintains an activated state in the deactivated section of the data output enable signal DQEN, and maintains a deactivated state in the activated section of the data output enable signal DQEN and the first read signal DQSPRE1B, and generates the fourth preamble signal DIS_DNB by inverting the second read signal DQSPRE2B in the activated section of the data output enable signal DQEN and the deactivated section of the first read signal DQSPRE1B.

Figure 10:
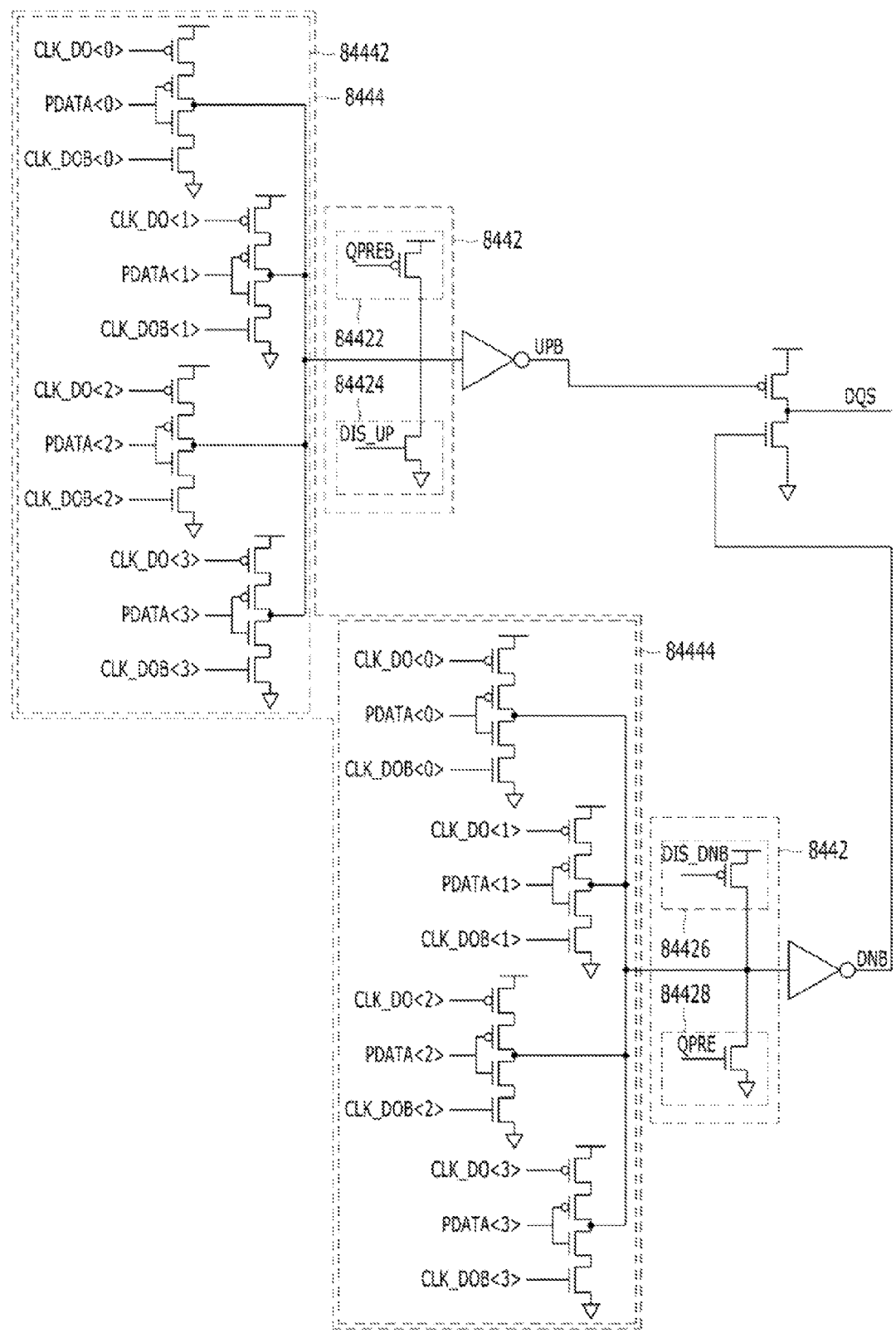
FIG. 10 is a detailed diagram of a strobe signal output block shown in FIG. 8.

FIG. 10 is a detailed diagram of a strobe signal output block 844 shown in FIG. 8.

Referring to FIG. 10, the first driving unit 8442 among the constituent elements of the strobe signal output block 844 defines the preamble section of the data strobe signal DQS in response to the first to fourth preamble signals QPREB, QPRE, DIS_UP and DIS_DNB.

The first driving unit 8442 includes a first pull-up driver 84422, a first pull-down driver 84424, a second pull-up driver 84426, and a second pull-down driver 84428.

The first pull-up driver 84422 determines whether or not a pull-up driving operation is performed on a pull-up output node UPB for the data strobe signal DQS in response to the first preamble signal QPREB.

The first pull-down driver 84424 determines whether or not a pull-down driving operation is performed on the pull-up output node UPB for the data strobe signal DQS in response to the third preamble signal DIS_UP.

The second pull-up driver 84426 determines whether or not a pull-up driving operation is performed on a pull-down output node DNB for the data strobe signal DQS in response to the fourth preamble signal DIS_DNB.

The second pull-down driver 84428 determines whether or not a pull-down driving operation is performed on the pull-down output node DNB for the data strobe signal DQS in response to the second preamble signal QPRE.

That is, the first preamble signal QPREB and the third preamble signal DIS_UP drive the pull-up output node UPB for the data strobe signal DQS in the first driving unit 8442. The second preamble signal QPRE and the fourth preamble signal DIS_DNB drive the pull-down output node DNB for the data strobe signal DQS in the first driving unit 8442.

An operation of the operation control block 842 and an operation of the first driving unit 8442 shown in FIGS. 9 and 10 are described in following Table 2.

TABLE 2

| DQSPRE1B | DQSPRE2B | DQEN | QPREB | QPRE | DIS_UP | DIS_DNB | FIRST DRIVING UNIT |
|---|---|---|---|---|---|---|---|
| H | H | H | H | L | L | H | NOT OPERATE |
| L | H | H | L | L | L | H | DQS = H |
| L | L | H | H | H | L | H | DQS = L |
| H | L | H | H | L | L | H | NOT OPERATE |
| H | H | L | H | L | H | L | DQS OUTPUT OFF |
| L | H | L | L | L | L | L | DQS = H |
| L | L | L | H | H | H | H | DQS = L |
| H | L | L | H | L | H | L | DQS OUTPUT OFF |

Referring to Table 2, the operation control block 842 fixes the third preamble signal DIS_UP and the fourth preamble signal DIS_DNB with a predetermined logic level in a section in which the data output enable signal DQEN is activated to a logic high level. Consequently, the first pull-down driver 84424 whose operation is determined in response to the third preamble signal DIS_UP and the second pull-up driver 84426 whose operation is determined in response to the fourth preamble signal DIS_DNB do not perform any operations in the section in which the data output enable signal DQEN is activated to the logic high level.

The logic levels of the first preamble signal QPREB and the second preamble signal QPRE are determined based on the logic levels of the first read signal DQSPRE1B and the second read signal DQSPRE2B.

The operation of the first driving unit 8442 is determined based on the logic levels of the first read signal DQSPRE1B and the second read signal DQSPRE2B in the section in which the data output enable signal DQEN is activated to the logic high level.

Therefore, the first driving unit 8442 does not operate or the data strobe signal DQS is driven to the predetermined logic level in the section in which the data output enable signal DQEN is activated to the logic high level. For reference, "CLK_DOB<0:3>" denotes complementary toggling clocks.

Referring to FIG. 2 again, the operation control block 842 sets the first preamble signal QPREB and the third preamble signal DIS_UP to have the same logic level and the second preamble signal QPRE and the fourth preamble signal DIS_DNB to have the same logic level in a section in which the data output enable signal DQEN is deactivated to a logic low level.

As illustrated in FIG. 9, the operation control block 842 has a circuit for generating the first preamble signal QPREB and a circuit for generating the third preamble signal DIS_UP having completely the same structure in the section in which the data output enable signal DQEN is deactivated to the logic low level. Similarly, the structure of a circuit for generating the second preamble signal QPRE is completely the same as the structure of a circuit for generating the fourth preamble signal DIS_DNB.

That is, the third preamble signal DIS_UP is generated with the completely same structure of the circuit as the structure of the circuit in which the first preamble signal QPREB is generated in response to the first read signal DQSPRE1B and the second read signal DQSPRE2B in the section in which the data output enable signal DQEN is deactivated to the logic low level. Similarly, the fourth preamble signal DIS_DNB is generated with the completely same structure of the circuit as the structure of the circuit in which the second preamble signal QPRE is generated in response to the first read signal DQSPRE1B and the second read signal DQSPRE2B in the section in which the data output enable signal DQEN is deactivated to the logic low level.

Therefore, the first driving unit 8442 forcibly turns off an output of the data strobe signal DQS or drives the data strobe signal DQS to a predetermined logic level by operating at all times in the section in which the data output enable signal DQEN is deactivated to the logic low level.

Figure 11:
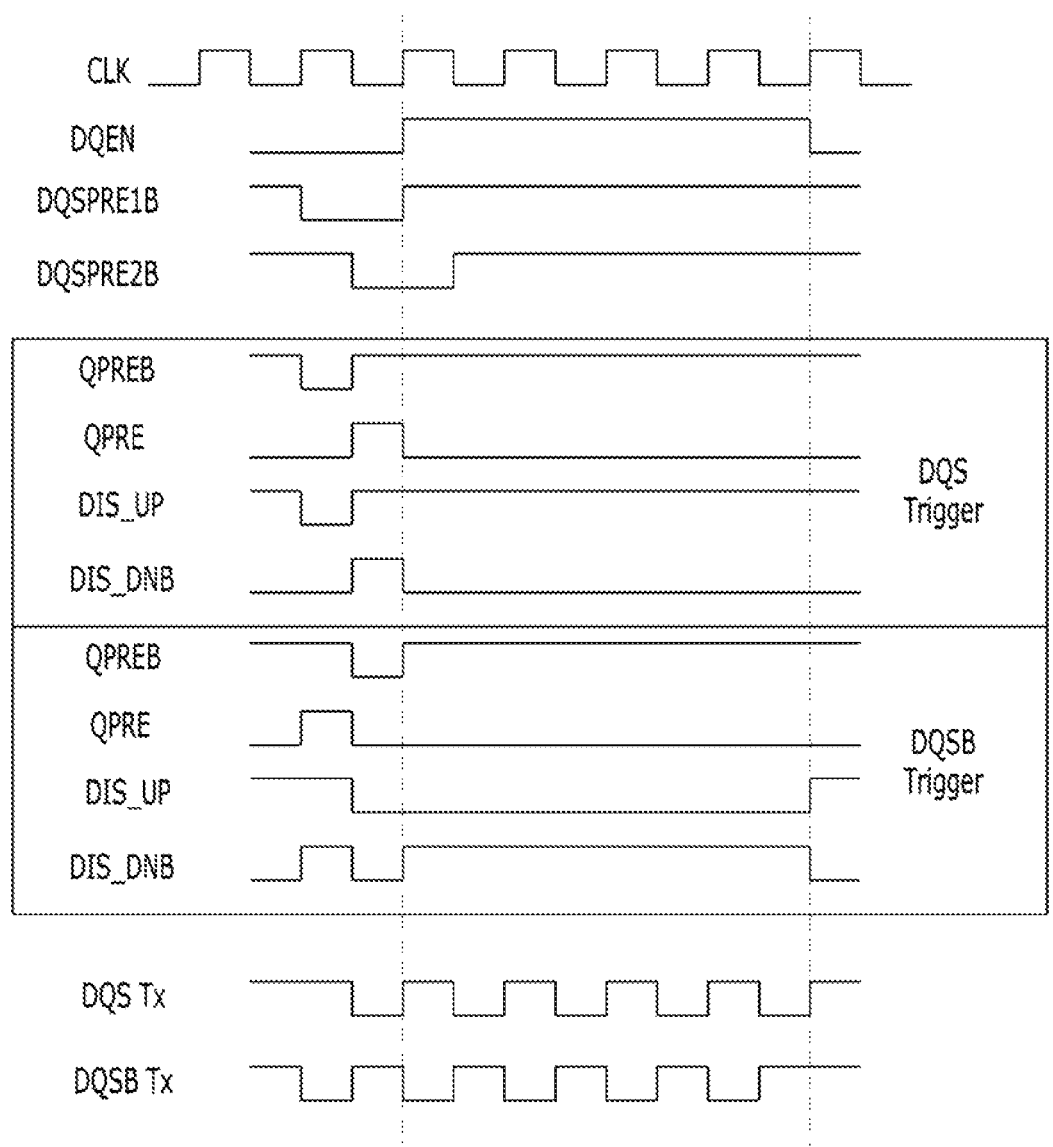
FIG. 11 is a timing diagram for describing an operation of the circuit for generating a data strobe signal shown in FIG. 8.

FIG. 11 is a timing diagram illustrating an operation of the semiconductor memory device shown in FIG. 8.

Referring to FIG. 11, the data strobe signal DQS defines the preamble section based on a moment when the data output enable signal DQEN is activated to a logic high level.

The logic levels of the first read signal DQSPRE1B and the second read signal DQSPRE2B are determined based on the CAS latency CL as described above with reference to FIG. 8. Therefore, their logic levels change as shown in FIG. 11 based on the CAS latency CL.

Specifically, the first read signal DQSPRE1B is activated during one clock cycle (1tCK) of the source clock CLK from a moment that comes ahead of a moment corresponding to the CAS latency CL, and the second read signal DQSPRE2B is activated after a half clock cycle (½tCK) of the source clock CLK from a moment when the first read signal DQSPRE1B is activated. Since the data output enable signal DQEN is deactivated, the first driving unit 8442 forcibly turns off the output of the data strobe signal DQS or drives the output of the data strobe signal DQS to the predetermined logic level in response to the first read signal DQSPRE1B and the second read signal DQSPRE2B.

The first read signal DQSPRE1B and the second read signal DQSPRE2B are sequentially activated at an interval of a half clock cycle (½tCK) of the source clock CLK during one clock cycle (1tCK) of the source clock CLK from a moment that comes ahead of a moment corresponding to the CAS latency CL.

Therefore, although the data output enable signal DQEN is deactivated during one clock cycle (1tCK) of the source clock CLK ahead of the CAS latency CL, the preamble section of the data strobe signal DQS may be normally set since the first read signal DQSPRE1B and the second read signal DQSPRE2B are properly activated.

Subsequently, the data output enable signal DQEN is activated, and the first read signal DQSPRE1B is deactivated based on the CAS latency CL, and then the second read signal DQSPRE2B is deactivated at an interval of a half clock cycle (½tCK) of the source clock CLK. Since the data output enable signal DQEN is activated and the first read signal DQSPRE1B is deactivated based on the CAS latency CL, the first driving unit 8442 does not perform any operations and the second driving unit 8444 operates. Therefore, the data strobe signal DQS begins to toggle in response to the source clock CLK.

That is, the logic levels of the first preamble signal QPREB and the second preamble signal QPRE are determined in response to the first read signal DQSPRE1B and the second read signal DQSPRE2B. Additionally, the logic levels of the third preamble signal DIS_UP and the second preamble signal QPRE are determined based on the first read signal DQSPRE1B and the second read signal DQSPRE2B.

Referring to FIG. 9, the circuits for generating the first preamble signal QPREB, the second preamble signal QPRE, the third preamble signal DIS_UP and the fourth preamble signal DIS_DNB have similar structures. It may be possible to identically design the circuits by properly controlling the sizes of inverters although there is a difference in the number of inverter steps. Even though PVT variations occur, the PVT variations have the same effect on all the signals DQEN, DQSPRE1B, DQSPRE2B, QPREB, QPRE, DIS_UP and DIS_DNB including the source clock CLK since the structures of the circuits for generating the first to fourth preamble signals QPREB, PQRE, DIS_UP and DIS_DNB are similar. The PVT variations simultaneously occurring in the signals DQEN, DQSPRE1B, DQSPRE2B, QPREB, QPRE, DIS_UP and DIS_DNB including the source clock CLK, do not have any influence on the generation of the data strobe signal DQS.

Thus, the moment when the logic levels of the first to fourth preamble signals QPREB, PQRE, DIS_UP and DIS_DNB change, may be synchronized with the edge of the source clock CLK at all times regardless of the variations in the PVT.

In accordance with the embodiments of the present invention as described above, the data output enable signal DQEN corresponding to the CAS latency CL is used when the preamble is section is defined in a process of generating the data strobe signal DQS. Consequently, a moment when the preamble section of the data strobe signal DQS is terminated may be fixed at a moment corresponding to the CAS latency CL at all times, regardless of the variations in the PVT.

In accordance with the embodiments of the present invention, a circuit for generating the data strobe enable signal DQSEN or a line for transmitting the data strobe enable signal DQSEN is not required since the data output enable signal DQEN that is already used to output internal data is used, and the data strobe enable signal DQSEN is not used when the data strobe signal DQS is generated. Therefore, the size of the semiconductor memory device may be minimized.

While the present invention has been described with respect to specific embodiments, the embodiments are not intended to be restrictive, but rather descriptive.

For example, although it is described in the embodiments of the present invention that the preamble section of the data strobe signal DQS corresponds to one clock cycle (1tCK) of the source clock CLK, the present invention is not limited to this, and a section which is longer than the one clock cycle (1tCK) of the source clock CLK may be defined as the preamble section of the data strobe signal DQS according to a designer's decision in accordance with this invention.

Also, dispositions and types of the logic gates and transistors described in the aforementioned embodiments may be implemented differently based on the polarity of the inputted signal.

Further it is noted that the present invention may be achieved in various ways through substitution, change, and modification, by those skilled in the art without departing from the scope of the present invention as defined by the following claims.

What is claimed is:

1. A semiconductor memory device, comprising:
    an enable signal generation portion configured to generate a data output enable signal started to be activated to a first logic level from a predetermined first moment corresponding to column address strobe (CAS) latency based on a read command;
    a strobe signal generation portion configured to generate a data strobe signal which has a preamble section until the data output enable signal is activated to the first logic level from a predetermined second moment corresponding to a predetermined clock cycle of a source clock ahead of the first moment based on the read command and toggles based on the source clock during an activated section of the data output enable signal;
    a data output portion configured to output internal data in synchronization with the data strobe signal during the activated section of the data output enable signal: and
    a read signal generation portion configured to generate a read signal which is activated to a second logic level at the second moment and deactivated to the first logic level at the first moment based on the read command, wherein the data output enable signal is activated at the first moment when one clock cycle of the source clock passes after the read signal is activated, wherein the first logic level is opposite to the second logic level.

2. The semiconductor memory device of claim 1, wherein each of the first moment and the second moment is synchronized with an edge of the source clock.

3. The semiconductor memory device of claim 2, wherein the second moment is ahead of the first moment by as much as one clock cycle of the source clock.

4. The semiconductor memory device of claim 1,
    wherein the read signal generation portion, comprising:
    a first read signal generation portion configured to generate the first read signal which is activated to a second logic level at the second moment and deactivated to the first logic level at the first moment based on the read command; and
    a second read signal generation portion configured to generate a second read signal by delaying the first read signal by as long as a half clock cycle of the source clock,
    wherein the first logic level is opposite to the second logic level.

5. The semiconductor memory device of claim 4, wherein the strobe signal generation portion includes:
    an operation control block configured to generate first to fourth preamble signals to define the preamble section ranging from the second moment to a moment when the data output enable signal is activated based on the first and second read signals and the data output enable signal; and
    a strobe signal output block configured to set the preamble section in the data strobe signal based on the first to fourth preamble signals, and make the data strobe signal toggle based on the source clock during the activated section of the data output enable signal.

6. The semiconductor memory device of claim 5, wherein the strobe signal output block includes:
    a first driving unit configured to drive an output node of the data strobe signal to a predetermined logic level in the preamble section based on the first to fourth preamble signals, and configured not to drive the output node of the data strobe signal during the activated section of the data output enable signal; and a second driving unit configured not to drive the output node of the data strobe signal in the preamble section, and configured to drive predetermined toggling pattern data to the output node of the data strobe signal based on the source clock during the activated section of the data output enable signal.

7. The semiconductor memory device of claim 6, wherein the operation control block includes:

a first signal generation unit configured to maintain an activated state in an activated section of the first read signal, and generate a first preamble signal by inverting the second read signal in a deactivated section of the first read signal;

a second signal generation unit configured to maintain a deactivated state in the activated section of the first read signal, and generate a second preamble signal by inverting the second read signal in the deactivated section of the first read signal;

a third signal generation unit configured to maintain a deactivated state in the activated section of the data output enable signal, and maintain an activated state in the deactivated section of the data output enable signal and the activated section of the first read signal, and generate a third preamble signal by inverting the second read signal in a section in which the data output enable signal and the first read signal are deactivated; and a fourth signal generation unit configured to maintain an activated state in the activated section of the data output enable signal, and configured to maintain a deactivated state in the deactivated section of the data output enable signal and the activated section of the first read signal, and generate a fourth preamble signal by inverting the second read signal in the deactivated sections of the data output enable signal and the first read signal.

8. The semiconductor memory device of claim 7, wherein the first driving unit includes:

a first pull-up driver configured to determine whether to perform a pull-up driving operation on a pull-up output node of the data strobe signal based on the first preamble signal;

a first pull-down driver configured to determine whether to perform a pull-down driving operation on the pull-up output node of the data strobe signal based on the third preamble signal;

a second pull-up driver configured to determine whether to perform the pull-up driving operation on the pull-down output node of the data strobe signal based on the fourth preamble signal; and a second pull-down driver configured to determine whether to perform the pull-down driving operation on the pull-down output node of the data strobe signal based on the second preamble signal.

9. The semiconductor memory device of claim 8, wherein the strobe signal output block includes:

a pattern data storage unit configured to store the toggling pattern data having an N-bit pattern; and a toggling clock generation unit configured to generate N toggling clocks having activated sections that do not overlap with each other and which are sequentially and repeatedly activated in synchronization with the toggling of the source clock during the activated section of the data output enable signal, wherein the second driving unit includes:

a third pull-up driver configured to drive the pull-up output node of the data strobe signal by corresponding the N-bit toggling pattern data to the N toggling clocks in a one-to-one manner; and a third pull-down driver configured to drive the pull-down output node of the data strobe signal by corresponding the N-bit toggling pattern data to the N toggling clocks in a one-to-one manner.

10. A method for operating a semiconductor memory device comprising:

generating a data output enable signal started to be activated to a first logic level from a predetermined first moment corresponding to column address strobe (CAS) latency based on a read command;

generating a read signal which is activated to a second logic level at a second moment and deactivated to the first logic level at the first moment based on the read command; and setting a preamble section of a data strobe signal which begins from a predetermined second moment corresponding to a predetermined clock cycle of a source clock ahead of the first moment based on the read command and terminates based on the activating of the data output enable signal, wherein the data output enable signal is activated at the first moment when one clock cycle of the source clock passes after the read signal is activated, wherein the first logic level is opposite to the second logic level.

11. The method of claim 10, wherein each of the first and second moments is synchronized with an edge of the source clock.

12. The method of claim 11, wherein the second moment is ahead of the first moment by as much as one clock cycle of the source clock.

13. The method of claim 10, further comprising:

generating a second read signal by delaying the first read signal by as long as a half clock cycle of the source clock.

14. The method of claim 13, wherein the setting of the preamble section includes:

generating first to fourth preamble signals to define the preamble section ranging from the second moment to a moment when the data output enable signal is activated based on the first and second read signals and the data output enable signal; and setting the preamble section in the data strobe signal based on the first to fourth preamble signals.

15. The method of claim 14, wherein the setting of the preamble section in the data strobe signal based on the first to fourth preamble signals includes:

driving an output node of the data strobe signal to a predetermined logic level in the preamble section based on the first to fourth preamble signals; and not driving the output node of the data strobe signal during the activated section of the data output enable signal.

16. The method of claim 15, wherein the making of the data strobe signal toggling includes:

not driving the output node of the data strobe signal in the preamble section; and driving predetermined toggling pattern data to the output node of the data strobe signal based on the source clock during the activated section of the data output enable signal.

17. The method of claim 16, wherein the generating of the first to fourth preamble signals includes:

maintaining an activated state in an activated section of the first read signal and generating a first preamble signal by inverting the second read signal in a deactivated section of the first read signal;

maintaining a deactivated state in the activated section of the first read signal and generating a second preamble signal by inverting the second read signal in the deactivated section of the first read signal;

maintaining a deactivated state during the activated section of the data output enable signal, and maintaining an activated state in the deactivated section of the data output enable signal and the activated section of the first read signal, and generating a third preamble signal by inverting the second read signal in the section in which the data output enable signal and the first read signal are deactivated; and maintaining an activated state during the activated section of the data output enable signal, and maintaining a deactivated state in the deactivated section of the data output enable signal and the activated section of the first read signal, and generating a fourth preamble signal by inverting the second read signal in the deactivated sections of the data output enable signal and the first read signal.

18. The method of claim 17, wherein the driving of the output node of the data strobe signal includes:

determining whether to perform a pull-up driving operation on a pull-up output node of the data strobe signal based on the first preamble signal;

determining whether to perform a pull-down driving operation on the pull-up output node of the data strobe signal based on the third preamble signal;

determining whether to perform the pull-up driving operation on the pull-down output node of the data strobe signal based on the fourth preamble signal; and determining whether to perform the pull-down driving operation on the pull-down output node of the data strobe signal based on the second preamble signal.

19. The method of claim 18, wherein the making of the data strobe signal toggle further includes:

receiving the toggling pattern data having an N-bit pattern; and generating N toggling clocks having activated sections that do not overlap with each other and which are sequentially and repeatedly activated in synchronization with the toggling of the source clock during the activated section of the data output enable signal, wherein the driving of the toggling pattern data includes:

driving the pull-up output node of the data strobe signal by corresponding the N-bit toggling pattern data to the N toggling clocks in a one-to-one manner; and driving the pull-down output node of the data strobe signal by corresponding the N-bit toggling pattern data to the N toggling clocks in a one-to-one manner.

* * * * *